United States Patent
Tsutsumi et al.

(10) Patent No.: US 9,121,576 B2
(45) Date of Patent: Sep. 1, 2015

(54) LIGHT WAVELENGTH CONVERSION UNIT

(71) Applicant: Koito Manufacturing Co., Ltd., Minato-ku (JP)

(72) Inventors: Yasuaki Tsutsumi, Shizuoka (JP);
Masanobu Mizuno, Shizuoka (JP);
Kazuhiro Ito, Shizuoka (JP)

(73) Assignee: KOITO MANUFACTURING CO., LTD., Minato-Ku, Tokyo (JP)

( * ) Notice: Subject to any disclaimer, the term of this patent is extended or adjusted under 35 U.S.C. 154(b) by 13 days.

(21) Appl. No.: 14/167,680

(22) Filed: Jan. 29, 2014

(65) Prior Publication Data

US 2014/0146547 A1    May 29, 2014

Related U.S. Application Data

(63) Continuation of application No. PCT/JP2012/004287, filed on Jul. 3, 2012.

(30) Foreign Application Priority Data

Aug. 4, 2011    (JP) ................................. 2011-170691

(51) Int. Cl.
*F21V 9/08* (2006.01)
*H01L 33/46* (2010.01)
*H01L 33/50* (2010.01)

(52) U.S. Cl.
CPC . *F21V 9/08* (2013.01); *H01L 33/46* (2013.01); *H01L 33/505* (2013.01)

(58) Field of Classification Search
CPC .......... F21V 9/08; H01L 33/505; H01L 33/46

USPC .................................................... 362/84, 343
See application file for complete search history.

(56) References Cited

U.S. PATENT DOCUMENTS

| 2005/0145864 | A1 | 7/2005 | Sugiyama et al. |
| 2010/0051988 | A1* | 3/2010 | Mitsuishi et al. ............... 257/98 |
| 2011/0284902 | A1 | 11/2011 | Daicho et al. |

FOREIGN PATENT DOCUMENTS

JP    2002-232017 A    8/2002
(Continued)

OTHER PUBLICATIONS

International Search Report (Form PCT/ISA/210) issued on Sep. 11, 2012, in International Application No. PCT/JP2012/004287 and an English translation thereof. (4 pages).
(Continued)

*Primary Examiner* — David V Bruce
(74) *Attorney, Agent, or Firm* — Buchanan Ingersoll & Rooney PC

(57) ABSTRACT

In a light wavelength conversion unit, a light wavelength conversion member is placed on the emission surface of a semiconductor light-emitting element. The light wavelength conversion member converts the wavelength of blue light, which has emitted from the semiconductor light-emitting element and entered from an incident surface, so as to emit yellow light and then emits the yellow light from an emission surface. A light reflection layer is provided on a lateral face in the surface of the light wavelength conversion member. Here, the lateral face excludes the incident surface and the emission surface. The light wavelength conversion member is roughened such that an average roughness Ra of the lateral face is 0.5 μm or above.

7 Claims, 3 Drawing Sheets

(56) References Cited

FOREIGN PATENT DOCUMENTS

| JP | 2003-218383 A | 7/2003 |
|---|---|---|
| JP | 2010-219163 A | 9/2010 |
| JP | 2010-537400 A | 12/2010 |
| JP | 2011124189 A | 6/2011 |
| WO | 2009/022316 A2 | 2/2009 |
| WO | 2010/061592 A1 | 6/2010 |

OTHER PUBLICATIONS

International Preliminary Report on Patentability (Form PCT/IB/373) and the Written Opinion of the International Searching Authority (Form PCT/ISA/237) issued on Feb. 4, 2014, in International Application No. PCT/JP2012/004287 and an English translation thereof.(10 pages).

Notification of Reasons for Refusal issued by the Japanese Patent Office in corresponding Japanese Patent Application No. 2011-170691 on Jun. 16, 2015.

* cited by examiner

FIG.7

| | CONDITION OF SIDE FACES | LIGHT REFLECTION LAYER PROVIDED ON SIDE FACES | OTHERS | LUMINANCE (ACTUAL MEASUREMENT) | LUMINANCE (SIMULATION) |
|---|---|---|---|---|---|
| COMPAR-ATIVE EXAMPLE | MIRROR SURFACE | NONE (WITHOUT) | — | 118 | 118 |
| EXEMPLARY EMBODIMENT 1 | ROUGHENED SURFACE | YES (WITH) | — | 124 | 233 |
| EXEMPLARY EMBODIMENT 2 | ROUGHENED SURFACE | YES (WITH) | LOW REFRACTIVE INDEX FILM PROVIDED ON EMISSION SURFACE | 253 | — |
| EXEMPLARY EMBODIMENT 3 | ROUGHENED SURFACE | YES (WITH) | GROOVES PROVIDED ON EMISSION SURFACE | 266 | — |
| EXEMPLARY EMBODIMENT 4 | ROUGHENED SURFACE | YES (WITH) | ASPERITIES OF 1 $\mu$m OR LESS FORMED ON EMISSION SURFACE | 275 | — |
| EXEMPLARY EMBODIMENT 5 | ROUGHENED SURFACE | YES (WITH) | OPTICAL FILTER + LOW REFRACTIVE INDEX FILM | 359 | |

LIGHT WAVELENGTH CONVERSION UNIT

CROSS-REFERENCE TO RELATED APPLICATIONS

This application is based upon and claims the benefit of priority from the prior Japanese Patent Application No. 2011-170691, filed on Aug. 4, 2011, and International Patent Application No. PCT/JP 2012/004287, filed on Jul. 3, 2012, the entire content of each of which is incorporated herein by reference.

BACKGROUND OF THE INVENTION

1. Field of the Invention

The present invention relates to a light wavelength conversion unit and, in particular, a light wavelength conversion unit provided with a light wavelength conversion member that converts the wavelength of incident light and then emits the thus wavelength-converted light.

2. Description of the Related Art

In recent years, use of semiconductor light-emitting elements, such as light emitting diodes (LEDs), has grown very quickly in automotive headlamps, general illumination and so forth. When white light is to be obtained using such a semiconductor light-emitting element, a light wave conversion member is generally provided in a position facing a light emitting surface of the semiconductor light-emitting element that emits light such as blue light, near-ultraviolet light or short-wavelength visible light. Here, the light wave conversion member converts light excited by the light-emitting element and then emits light having a different wavelength. In order to increase the luminance of a light emitting device including the semiconductor light-emitting element, it is vitally important to not only increase the luminance of the semiconductor light-emitting element itself but also enhance the extraction efficiency of light by the light wavelength conversion member. Proposed is an illumination apparatus where a phosphor-containing member having an incident surface or emission surface, by which to enhance the extraction efficiency of light, used as a roughened surface is placed in a position facing the LED.

Even in the case of the aforementioned proposed illumination apparatus where the emission surface is used as the roughened surface, part of light in the emission surface is reflected inside the light wavelength conversion member. Such light reflected thereinside is partially guided through the interior of the member and reaches side faces thereof and therefore such light is finally emitted from the side faces as well. However, as light is emitted from the surfaces other than the emission surface, the amount of light emitted from the emission surface is reduced and therefore it is difficult to enhance the luminance of the emission surface.

SUMMARY OF THE INVENTION

The present invention has been made to solve the above-described problems, and a purpose thereof is to provide a light wavelength conversion unit having a high extraction efficiency of light.

To resolve the foregoing problems, a light wavelength conversion unit according to one embodiment of the present invention includes: a light wavelength conversion member configured to convert a wavelength of light that has entered from an incident surface and configured to emit the wavelength-converted light from an emission surface; and a light reflection layer configured to reflect light inside the light wavelength conversion member, the light reflection layer being provided on a predetermined surface in a surface of the light wavelength conversion member, wherein the predetermined surface excludes the incident surface and the emission surface. The light wavelength conversion member is such that an average roughness (arithmetic mean roughness) Ra of the predetermined surface is greater than or equal to 0.5 μm.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 7 shows measurement results of luminance in a comparative example and each exemplary embodiment and simulation results.

DETAILED DESCRIPTION OF THE INVENTION

Figure 1:
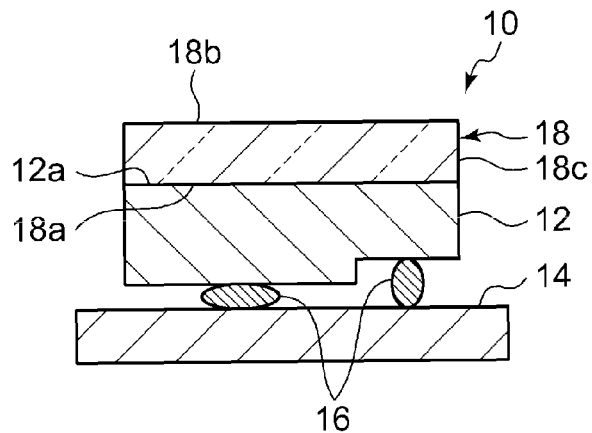
FIG. 1 shows a structure of a light emitting module according to a comparative example.

A light wavelength conversion unit according to one embodiment of the present invention includes a light wavelength conversion member for converting the wavelength of light that has entered from an incident surface and for emitting the wavelength-converted light from an emission surface, and a light reflection layer for reflecting light inside the light wavelength conversion member. Here, the light reflection layer is provided on a predetermined surface in a surface of the light wavelength conversion member, and the "predetermined surface" excludes the incident surface and the emission surface. The light wavelength conversion member is such that an average roughness Ra of the predetermined surface is greater than or equal to 0.5 μm.

It was verified, through the results of research and development done by the inventors of the present invention, that the luminance of light emitted from the emission surface can be raised by employing the following structures. That is, such a surface is used, as a roughened surface, in the predetermined surface excluding the incident surface and the emission surface and, furthermore, the light reflection layer is provided on the predetermined surface, thereby increasing the luminance of light emitted from the emission surface. By employing this embodiment, therefore, the emission of light from the predetermined surface can be avoided, so that the extraction efficiency of light from the light wavelength conversion member can be enhanced.

The light wavelength conversion unit may further include a low refractive index film having a refractive index, which is lower than that of the light wavelength conversion member, wherein the low refractive index film is provided on the emission surface. Provision of a low refractive index film allows a part of light otherwise reflected inside, when no low refractive index film is provided, to be emitted to the exterior. Thus, this can also enhance the extraction efficiency of light.

The light wavelength conversion unit may further include an optical filter for transmitting light having an excitation wavelength of the light wavelength conversion member and for reflecting light having florescence wavelength of the light wavelength conversion member, wherein the optical filter is provided on the incident surface. By employing this embodiment, the light, which is reflected inside by the emission surface and the like and is then emitted from the incident surface, can be inhibited. Thus, the amount of light emitted from the emission surface can be increased, so that the extraction efficiency of light can be enhanced.

Asperities, whose height is less than or equal to 1 μm, may be formed on the emission surface. It was verified, through the results of research and development done by the inventors of the present invention, that provision of such asperities on the emission surface, combined with the roughening of the predetermined surface and provision of the light reflection layer thereon, has increased the luminance of the emission surface. By employing this embodiment, too, the extraction efficiency of light can be enhanced.

The invention will now be described by reference to the preferred embodiments. This does not intend to limit the scope of the present invention, but to exemplify the invention.

The exemplary embodiments of the present invention will be described in detail, with reference to the accompanying drawings, by comparing them with a comparative example.

Comparative Example

FIG. 1 shows a structure of a light emitting module 10 according to a comparative example. The light emitting module 10 includes a semiconductor light-emitting element 12, a substrate 14, and light wavelength conversion member 18.

A flip-chip type LED is used as the semiconductor light-emitting element 12. An underside of the semiconductor light-emitting element 12 is bonded and thereby secured to a pattern of the substrate 14 with Au bumps 16 held between the semiconductor light-emitting element 12 and the substrate 14. It is to be noted here that the semiconductor light-emitting element 12 is not limited to the flip-chip type only and, for example, it may be a face-up type or vertical chip type. The semiconductor light-emitting element 12 as used herein is one that emits blue light. Note that the semiconductor light-emitting element 12 as used herein may also be one that generates light ranging from near-ultraviolet light to short-wavelength visible light.

The substrate 14 used herein is formed of AlN (aluminum nitride). A pattern having a form of electrode is provided on top of the substrate 14 with Au. It goes without saying that the material constituting the substrate 14 is not limited to AlN, and the substrate 14 may be formed of other material such as alumina, silicon, mullite, aluminum or copper. The semiconductor light-emitting element 12 is mounted on the pattern of the substrate 14 through the medium of the Au bumps 16, which is disposed between the semiconductor light-emitting element 12 and the substrate 14.

The light wavelength conversion member 18 is made of a so-called light emitting ceramic or fluorescent ceramic. And the light wavelength conversion member 18 can be obtained by sintering a ceramic body prepared from yttrium aluminum garnet (YAG) powder, which is a phosphor excited by ultraviolet light. The light wavelength conversion member 18 generates yellow light that is excited by blue light. Note that the light wavelength conversion member 18 may be fabricated using granular paste, which is produced such that phosphor powder and transparent binder are mixed together. Note also that the light wavelength conversion member 18 may be a glass plate containing the phosphors, which is fabricated such that phosphor powder and glass powder are mixed together and then heated.

It is to be noted here that the phosphors contained in the light wavelength conversion member 18 are not limited to those that are excited by blue light and thereby generates yellow light. If, for example, the semiconductor light-emitting element 12 generates light ranging from near-ultraviolet light to short-wavelength light, the light wavelength conversion member 18 may contain yellow phosphors, which are excited by this light and thereby generates yellow light, and blue phosphors, which are excited by this light and thereby generates blue light. Also, light generated by the light emitting module 10 is not limited to white light, and the light emitting module 10 may be so provided as to generate colored light. In such a case, the phosphors to be contained in the light wavelength conversion member 18 are appropriately determined in accordance with the color of light emitted by the light emitting module 10.

The light wavelength conversion member 18 is cut such that the shape of an incident surface 18a is approximately identical to that of a light emitting surface 12a of the semiconductor light-emitting element 12. The light wavelength conversion member 18 is bonded to the semiconductor light-emitting element 12 such that the incident surface 18a is fixed firmly to the light emitting surface 12a of the semiconductor light-emitting element 12 using an adhesive. As a result, the light emitted by the semiconductor light-emitting element 12 enters inside the light wavelength conversion member 18 from the incident surface 18a and then emits to the exterior from an emission surface 18b.

In the comparative example, side faces 18c are not roughened and remain as flat surfaces, and no light reflection layer obtained as a result of vapor deposition of aluminum, for instance, is provided on the side faces 18c.

First Exemplary Embodiment

Figure 2:
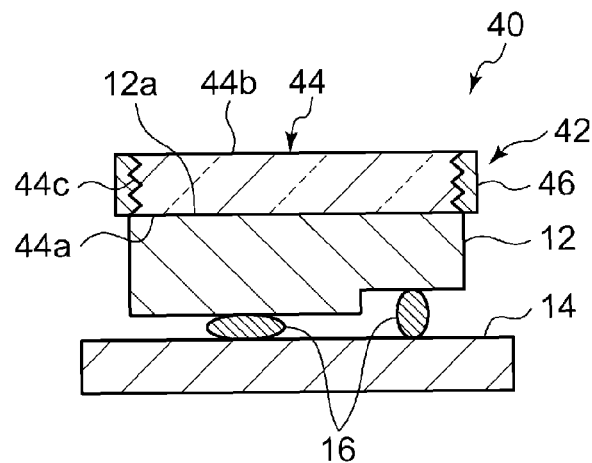
FIG. 2 shows a structure of a light emitting module according to a first embodiment.

FIG. 2 shows a structure of a light emitting module 40 according to a first embodiment. Hereinbelow, the components in each of the following exemplary embodiments identical to those of the first embodiment are given the identical reference numerals, and the repeated description thereof will be omitted. The light emitting module 40 includes a semiconductor light-emitting element 12, a substrate 14, and a light wavelength conversion unit 42. The light wavelength conversion unit 42 has a light wavelength conversion member 44 and a light reflection layer 46.

The light wavelength conversion member 44 is similar to the light wavelength conversion member 18 according to the comparative example, except that side faces 44c of the light wavelength conversion member 44 are roughened such that an average roughness Ra thereof is greater than or equal to 0.5 μm. The light reflection layer 46 is provided on the side face 44c so that light can be reflected inside the light wavelength conversion member 44. The light reflection layer 46 is formed by vapor-depositing aluminum on the side face 44c. Instead, silver may be vapor-deposited on the side face 44c so as to form the light reflection layer 46. Also, the light reflection layer 46 may be provided on surfaces other than the side faces 44c. In such a case, the light reflection layers 46 are provided on predetermined surfaces excluding the incident surface 44a and the emission surface 44b in the surfaces of the light wavelength conversion member 44.

Second Exemplary Embodiment

Figure 3:
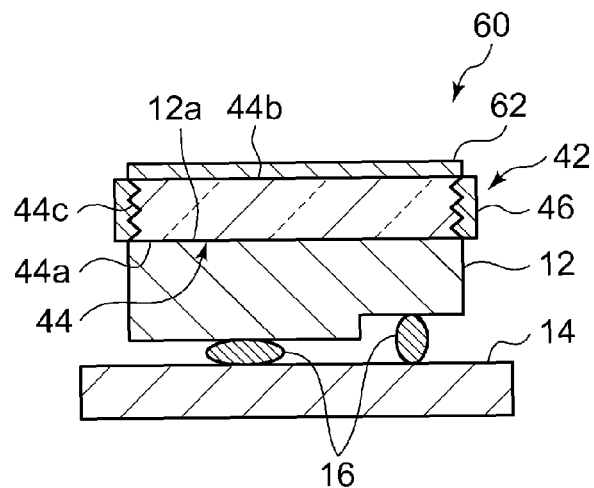
FIG. 3 shows a structure of a light emitting module according to a second embodiment.

FIG. 3 shows a structure of a light emitting module 60 according to a second embodiment. The light emitting module 60 includes a semiconductor light-emitting element 12, a substrate 14, a light wavelength conversion unit 42, and a low refractive index film 62. The low refractive index film 62 is formed of silicone having a refractive index lower than that of the light wavelength conversion member 44. The light wavelength conversion member 44 formed of YAG has a refractive index of about 1.8, whereas the low refractive index film 62 formed of silicone has a refractive index of about 1.4. It goes without saying that the material constituting the low refractive index film 62 is not limited thereto. The low refractive index film 62 has uniform thickness. The low refractive index film 62 is placed on the emission surface 44b of the light wavelength conversion member 44.

Third Exemplary Embodiment

Figure 4:
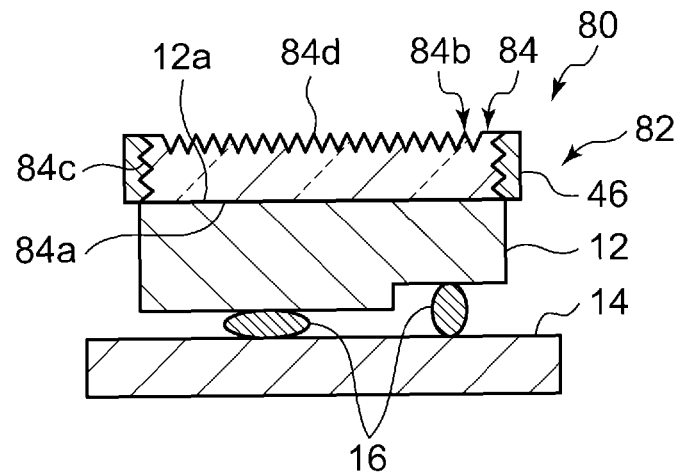
FIG. 4 shows a structure of a light emitting module according to a third embodiment.

FIG. 4 shows a structure of a light emitting module 80 according to a third embodiment. The light emitting module 80 includes a semiconductor light-emitting element 12, a substrate 14, and a light wavelength conversion unit 82. The light wavelength conversion unit 82 has a light wavelength conversion member 84 and a light reflection layer 46. The light wavelength conversion member 84 is similar to the light wavelength conversion member 44 according to the first exemplary embodiment, except that grooves 84d are provided in the emission surface 84b. Thus, side faces 84c of the light wavelength conversion member 84 are roughened such that the average roughness Ra thereof is greater than or equal to 0.5 μm. Also, the light reflection layer 46 is provided on the side face 84c of the light wavelength conversion member 84. Each groove 84d is in a V-shape, and a plurality of such grooves 84d are provided on the emission surface 84b with no gap therebetween.

Fourth Exemplary Embodiment

Figure 5:
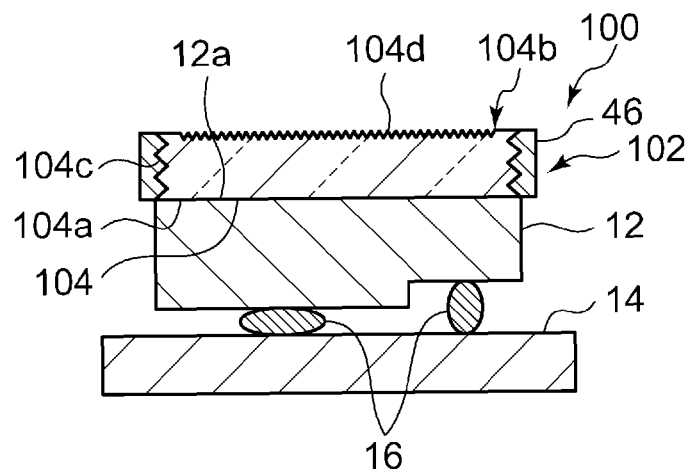
FIG. 5 shows a structure of a light emitting module according to a fourth embodiment.

FIG. 5 shows a structure of a light emitting module 100 according to a fourth embodiment. The light emitting module 100 includes a semiconductor light-emitting element 12, a substrate 14, and a light wavelength conversion unit 102. The light wavelength conversion unit 102 has a light wavelength conversion member 104 and a light reflection layer 46. In the light wavelength conversion member 104, so-called "moth-eye" fine asperities 104d, whose height is less than or equal to 1 μm, are formed in the emission surface 104b. Except for the fine asperities 104d, the light wavelength conversion member 104 is similar to the light wavelength conversion member 44 according to the first exemplary embodiment. Thus, the side faces 104c of the light wavelength conversion member 104 are roughened such that the average roughness Ra thereof is greater than or equal to 0.5 μm. Also, the light reflection layer 46 is provided on the side face 104c of the light wavelength conversion member 104.

Fifth Exemplary Embodiment

Figure 6:
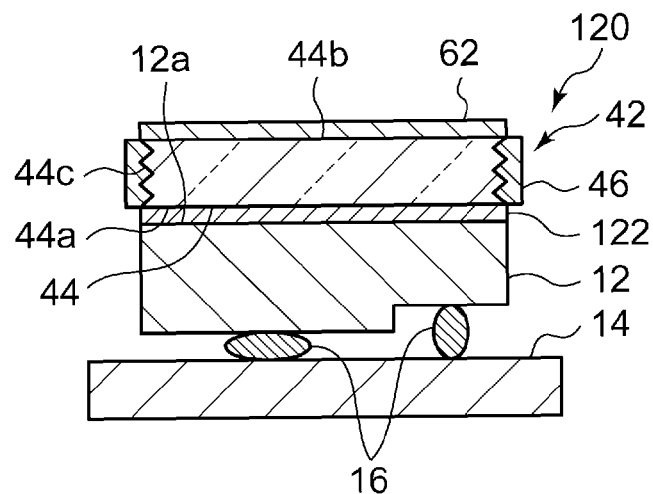
FIG. 6 shows a structure of a light emitting module according to a fifth embodiment.

FIG. 6 shows a structure of a light emitting module 120 according to a fifth embodiment. The light emitting module 120 is configured the same way as the light emitting module 60 according to the third exemplary embodiment, expect that an optical filter 122 is provided between the light emitting surface 12a of the semiconductor light-emitting element 12 and the incident surface 44a of the light wavelength conversion member 44.

The optical filter 122 is firmly fixed to both the incident surface 44a of the light wavelength conversion member 44 and the light emitting surface 12a of the semiconductor light-emitting element 12 by bonding or the like. The optical filter 122 transmits light having an excitation wavelength of the light wavelength conversion member 44 and reflects light having a florescence wavelength of the light wavelength conversion member 44. The light wavelength conversion member 44 is excited by blue light and emits yellow light. Thus, the optical filter 122 is so provided as to transmit the blue light and reflect yellow light. Provision of the optical filter 122 as with the fifth embodiment allows light directed toward the semiconductor light-emitting element 12, among the light converted into yellow light by the light wavelength conversion member 44, to be reflected again toward the emission surface 44b.

FIG. 7 shows measurement results of luminance in the comparative example and each exemplary embodiment and simulation results. It is evident from these results that the luminance in the first exemplary embodiment improves over that in the comparative example. Thus, it was verified that the extraction efficiency of light has improved by performing the roughing process on the side faces of the light wavelength conversion member and further providing the light reflection layer.

The simulation is run on the comparative example and the first exemplary embodiment only. SPEOS (registered trademark) is used as an optical analysis software. In the simulation, the luminance of the first exemplary embodiment doubles that of the comparison example and therefore a significantly large effect was confirmed. It is conceivable that, in the future, the actual advantageous effect gained by the roughing of the side faces of the light wavelength conversion member and further provision of the light reflection layer can be further improved by further optimizing the degree of the roughening of the side faces thereof.

It was also verified that the luminance in each of the second to fifth exemplary embodiments is further significantly improved. Thus, provision of the low refractive index film on the emission surface of the light wavelength conversion member, provision of the grooves in the emission surface thereof, provision of fine asperities on the emission surface thereof and provision of the optical filter between the light emitting surface of the semiconductor light-emitting element and the incident surface of the light wavelength conversion member prove most significantly effective when combined with the roughing of the side faces of the light wavelength conversion member and provision of the light reflection layer.

The present invention is not limited to the above-described embodiments only, and those resulting from any appropriate combination of components in the embodiments are also effective as embodiments. Also, it is understood by those skilled in the art that modifications such as various changes in design may be added to the embodiments based on their knowledge and that the embodiments added with such modifications are also within the scope of the present invention.

What is claimed is:

1. A light wavelength conversion unit comprising:
    a light wavelength conversion member configured to convert a wavelength of light that has entered from an incident surface and configured to emit the wavelength-converted light from an emission surface; and
    a light reflection layer configured to reflect light inside the light wavelength conversion member, the light reflection layer being provided on a predetermined surface in a surface of the light wavelength conversion member, wherein the predetermined surface excludes the incident surface and the emission surface,
    wherein the light wavelength conversion member is such that an average roughness Ra of the predetermined surface is greater than or equal to 0.5 μm.

2. A light wavelength conversion unit according to claim 1, further comprising a low refractive index film having a refractive index, which is lower than that of the light wavelength conversion member, wherein the low refractive index film is provided on the emission surface.

3. A light wavelength conversion unit according to claim 1, further comprising an optical filter configured to transmit light having an excitation wavelength of the light wavelength conversion member and configured to reflect light having a florescence wavelength of the light wavelength conversion member, wherein the optical filter is provided on the incident surface.

4. A light wavelength conversion unit according to claim 1, wherein asperities, whose height is less than or equal to 1 μm, is formed on the emission surface.

5. A light wavelength conversion unit according to claim 2, further comprising an optical filter configured to transmit light having an excitation wavelength of the light wavelength conversion member and configured to reflect light having a florescence wavelength of the light wavelength conversion member, wherein the optical filter is provided on the incident surface.

6. A light wavelength conversion unit according to claim 2, wherein asperities, whose height is less than or equal to 1 μm, is formed on the emission surface.

7. A light wavelength conversion unit according to claim 3, wherein asperities, whose height is less than or equal to 1 μm, is formed on the emission surface.

* * * * *